United States Patent

Kuraishi et al.

[11] Patent Number: 6,074,567
[45] Date of Patent: Jun. 13, 2000

[54] METHOD FOR PRODUCING A SEMICONDUCTOR PACKAGE

[75] Inventors: Fumio Kuraishi; Toshihisa Yoda; Mitsuharu Shimizu, all of Nagano, Japan

[73] Assignee: Shinko Electric Industries Co., Ltd., Nagano, Japan

[21] Appl. No.: 09/021,047

[22] Filed: Feb. 9, 1998

[30] Foreign Application Priority Data

Feb. 12, 1997 [JP] Japan ..................................... 9-027725

[51] Int. Cl.$^7$ ....................................................... H01B 5/14
[52] U.S. Cl. ................................ 216/18; 216/20; 427/97; 427/98; 427/123; 428/901
[58] Field of Search .................. 216/13, 17, 18, 216/20; 427/96, 97, 98, 123, 305, 404; 428/901

[56] References Cited

U.S. PATENT DOCUMENTS

| | | | |
|---|---|---|---|
| 5,306,670 | 4/1994 | Mowatt et al. | 29/832 |
| 5,665,473 | 9/1997 | Okoshi et al. | 428/457 |
| 5,911,112 | 6/1999 | Kirkman | 438/612 |

FOREIGN PATENT DOCUMENTS 3-64985 3/1991 Japan .
3-194992 8/1991 Japan .

*Primary Examiner*—Randy Gulakowski
*Assistant Examiner*—Allan Olsen
*Attorney, Agent, or Firm*—Pennie & Edmonds LLP

[57] ABSTRACT

A semiconductor package includes a laminate of substrates having a cavity 16, through-holes 25 and circuit patterns, wherein the through-holes 45 and some of the circuit patterns 18 are coated with a plated nickel/gold coating 50. A method for producing the package comprises a step for producing a laminate by sandwiching circuit boards 20a, each having an opening 14 for the cavity and inner circuit patterns 18, with a pair of circuit boards 20b having no opening, a first plating step including first forming bores 44 for the through-holes and then applying a plated copper coating 48 to the inner wall of the through-hole or others, a step for forming outer circuit patterns on the circuit board 20b by the etching, and a step for opening the cavity 16 by providing an opening 60 in the circuit board 20b, and a second plating step for applying a plated nickel coating and a plated gold coating 50 to the inner circuit patterns 18 in the cavity 16, wherein a further step is interposed between the first plating process and the cavity-opening process, for applying a plated nickel coating 58 to the through-holes.

10 Claims, 6 Drawing Sheets

METHOD FOR PRODUCING A SEMICONDUCTOR PACKAGE

BACKGROUND OF THE INVENTION

1. Field of the Invention

The present invention relates to a method for producing a semiconductor package and, particularly, to a method for producing a semiconductor package having fine circuit patterns arranged at a high density.

2. Description of the Related Art

A semiconductor package such as PPGA (Plastic Pin Grid Array) (which has a plurality of through holes into which respective pins are inserted); PBGA (Plastic Ball Grid Array) (which has a circuit pattern providing with land portions on which external connecting terminals, such as solder balls, are formed); or PLGA (Plastic Land Grid Array) (which has a circuit pattern providing with land portions which are served by themselves as external connecting terminals) is constructed by laminating a plurality of circuit boards with each other, and solder balls are bonded to a mounting surface as external terminals, wherein each of the circuit boards is composed of an electro-insulating substrate made of glass-epoxy resin, glass-polyimid resin, BT resin or others, on which an electro-conductive layer such as a copper foil is clad, as shown in FIG. 10.

A structure of the above semiconductor package 10 will be described with reference to FIG. 10.

An opening 14 is formed in each of the laminated resin boards 12 so that a cavity 16 is formed for accommodating a semiconductor element.

Inner circuit boards 20a and outer circuit boards 20b carrying circuit patterns 18 on both surfaces thereof are formed by etching the copper foil of the respective resin board.

Bonding portions of the circuit pattern 18 are formed in the vicinity of the periphery of the opening 14, for the connection of the circuit pattern to the semiconductor element by a wire bonding method. An area of the opening 14 in the inner circuit board 20a is determined so that, when a laminate is formed by laminating the circuit boards 20a with each other, a bonding portion is obtained in the respective circuit board 20a. Thus, when the inner circuit boards 20a and the outer circuit boards 20b are laminated with each other, the size of the cavity 16 in the respective circuit board 20a, 20b becomes larger as the position of the circuit board is higher in the cavity 16 of the laminated circuit board.

Each of the inner circuit boards 20a and the outer circuit boards 20b is adhered to the other circuit board via an adhesive sheet 22 (prepreg). Also, a resist (not shown) is coated on a surface of the circuit board 20a to flatten the surface and enhance the adhesivity between the circuit boards by the adhesive sheet 22. In this regard, if the property of the adhesive sheet 22 allows, the respective circuit boards 20a, 20b may be adhered to each other without the resist coating.

On the outer surface of the circuit board 20b, there are formed as a part of the circuit pattern 18 a land 26a for connecting an external terminal 24 (a bump in this case), a connector section 26b for the connection to a circuit element such as a capacitor or a resistor, or a conductor 26c for mounting a heat-radiation plate made of a metallic plate. A protective coating 28 such as a solder resist is provided on the outer surface of the circuit board 20b, while taking a care so that the land 26a, the connector section 26b and the conductor are solely exposed. Also, the bonding portions are electrically conductive to the lands 26a, the connector section 26b, or the like, via through-holes 29.

The external terminals 24 are mounted to the land 26a, and a circuit element and a heat-radiating plate 30 are mounted to the connector section 26b and the conductor 26c.

However, the above-mentioned prior art method for producing a semiconductor package has the following problems:

In the prior art, the through-hole 29 is generally formed in such a manner that a laminate is prepared by laminating the inner circuit boards 20a and the outer circuit boards 20b with each other via the adhesive sheets 22, and a bore is provided through the laminate, wherein electroless plating and an electroplating of copper are applied to the inner wall of the bore to provide a conductor for connecting circuit patterns in the inner circuit boards 20a with each other and finally a nickel plating and a gold plating are applied to the conductor.

Although there is a case wherein the user demands in the product specification that, even after being subjected to a predetermined heat-shock test, the semiconductor package should be free from short-circuit accidents in an electric test for the through-hole 29 and from a ply separation between circuit patterns formed on the respective circuit boards 20a, 20b, the through-hole 29 having a conductor formed of a plated nickel coating and a plated gold coating does not satisfy such a demand, but is damaged by about 100 cycles of a heat-shock test wherein a temperature varies in a range from −55° C. to 125° C., while the product specification demands 1000 cycles.

Accordingly, in a PPGA type semiconductor package, a pin is inserted into a through-hole and soldered thereto although not shown, and in a PLGA type semiconductor package, a solder is filled in a through-hole so that the demand for the heat-shock test is satisfied. However, the pin-insertion method requires a complicated process, while the solder-filling method has an environmental contamination problem due to lead contained in the solder.

To improve the resistance to heat-shock of the through-hole without using the pin-insertion or solder-filling method, it has been found that if two plated nickel coatings are applied onto the through-hole conductor, resistance to cracking and/or debonding is improved to enhance the reliability.

However, if a nickel-plating is merely applied twice to the laminate, the nickel-plating is also applied to the bonding portion of the circuit pattern 18 in the inner circuit board 20a in the cavity 16. This results in a short-circuit between the circuit patterns 18 in the inner circuit boards 20a which are exposed in the cavity 16, because the bonding portions thereof becomes thicker and wider due to the double plated nickel coatings, especially when the number of pins of the semiconductor element to be mounted into the cavity 16 increases very much and the bonding portions of the circuit patterns 18 in the inner circuit boards 20a are fine and dense. Similarly, when an electroless plating and an electro plating of copper are applied to the inner wall of a bore provided in the laminate formed by laminating the inner circuit boards 20a and the outer circuit boards 20b via the adhesive sheets 22, for the purpose of forming the through-hole, the plated metal is deposited on the bonding portion of the circuit pattern 18 in the inner circuit board 20a in the cavity 16 to result in the short-circuit between the bonding portions of the circuit patterns 16.

Accordingly, when the electroless plating and the electroplating of copper are applied to the through-hole or the nickel plating is applied, it is necessary to mask the interior of the cavity 16 and remove the mask after the plating, which lowers the workability.

SUMMARY OF THE INVENTION

Thus, an object of the present invention is to solve the above problem by providing a method for producing a semiconductor package capable of forming a through-hole resistant to heat shock without lowering the workability.

The above object of the present invention is achievable by a method for producing a semiconductor package comprising a laminate of a plurality of resinous substrates having a cavity for accommodating a semiconductor element, through-holes and circuit patterns; the through-holes and some of the circuit patterns being coated with a plated nickel/gold coating; characterized in that said process comprising a step for producing an inner circuit board, wherein a resinous substrate clad with a metallic foil is bored to have an opening for forming the cavity and subjected to an etching treatment to form inner circuit patterns on the surface thereof; a step for forming the laminate by sandwiching a plurality of the inner circuit boards between a pair of outer circuit boards having no opening; a first plating step including first forming bores for the through-holes an then applying a plated copper coating to the inner wall of the through-hole and the metallic foil covering the outer surface of the outer circuit board; a step for forming outer circuit patterns on the outer surface of the outer circuit board by etching the metallic foil and the plated copper coating on the outer surface of the outer circuit board; and a step for opening the cavity by providing an opening in at least one of the outer circuit boards corresponding to the opening of the inner circuit board; a second plating step for applying a plated nickel coating and a plated gold coating to the inner circuit patterns in the cavity; wherein a further step is interposed between the first plating process and the process for forming outer circuit patterns and/or between the process for forming outer circuit patterns and the process for opening the cavity, for applying a plated nickel coating to the through-holes while sealing the cavity with the outer circuit board.

According this method, it is unnecessary to mask the bonding portions of the circuit patterns in the inner circuit board when the electroless/electro-plating of copper or the nickel-plating is applied to the through-holes, and therefore to remove the mask after the plating, whereby the workability is improved. Also, it is possible to form two or more plated nickel coatings in the through-hole, whereby the through-hole resistant to heat-shock is obtainable.

If a thickness of the plated nickel coating obtained by the nickel-plating process is in a range from 1 to 30 $\mu$m, the through-hole resistant to heat-shock is obtainable. Such a nickel-plating process may be either electro-plating or electroless-plating.

Alternatively to the nickel-plating process, either of a nickel/cobalt alloy-plating, a nickel/tungsten alloy plating or a nickel/tungsten/cobalt alloy plating may be applied.

DETAILED DESCRIPTION OF THE INVENTION

Figure 10:
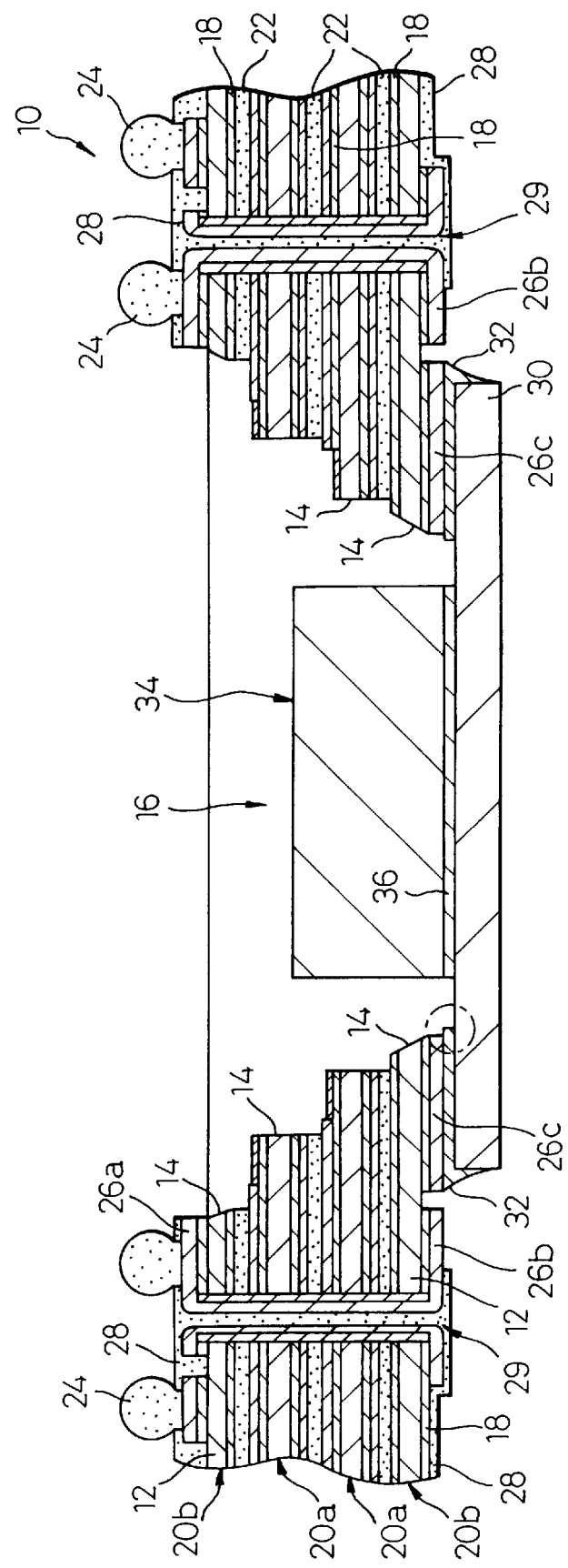
FIG. 10 is a side sectional view of a semiconductor package known in the prior art.

A method for producing a semiconductor package according to the present invention will be described with reference to the preferred embodiments illustrated in the attached drawings. The semiconductor package used in the embodiments is of a PLGA type. The same reference numerals as those in FIG. 10 illustrating the prior art are used for denoting similar parts in the embodiments.

The method for producing a semiconductor package comprises the following processes.

A first step is a process for producing an inner circuit board, which will be described with reference to FIG. 1. As the inner circuit board, a resinous substrate is used, which has a metallic foil (a copper foil in this embodiment) clad on a surface (both surfaces in this embodiment) thereof.

FIG. 1(*a*) shows a side-section of the resinous substrate 12 having a copper foil 11 on the surface thereof. An opening 14 is provided in the resinous substrate 12, for forming a cavity 16 for accommodating a semiconductor element. The resinous substrate 12 is made of electro-insulating resin such as glass/epoxy, glass/polyimide or BT resin.

In FIG. 1(*b*), the resinous substrate 12 is etched to have circuit patterns 18 on the surface thereof, thus forming an inner circuit board 20*a*.

The circuit pattern 18 is formed by coating a resist on the surface of the copper foil 11, which is then exposed to form a resist pattern, and thereafter removing part of the copper foil 11 not covered with the resist by the etching.

A bonding portion of the circuit pattern 18 to be connected to the semiconductor element by wire-bonding is formed in the vicinity of the periphery of the opening 14. The size of the opening 14 formed in the inner circuit board 20*a* is selected so that a zone for providing the bonding portion in the respective inner circuit board 20*a* is obtainable when a laminate is formed by laminating a plurality of inner circuit boards 20*a* with each other. An area of the opening becomes larger as the inner circuit board 20*a* occupies an upper position when the same is laminated with other inner circuit boards to form the cavity 16.

Figure 1A:
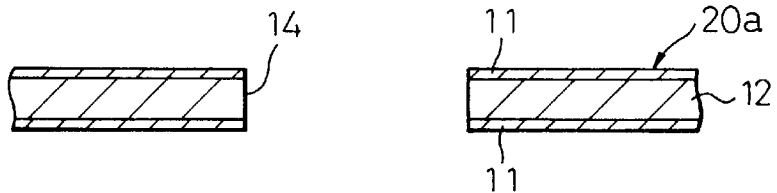
FIGS. 1(*a*) to 1(*e*) illustrate processes for producing an inner circuit board used for the production of a semiconductor package.
Figure 1B:
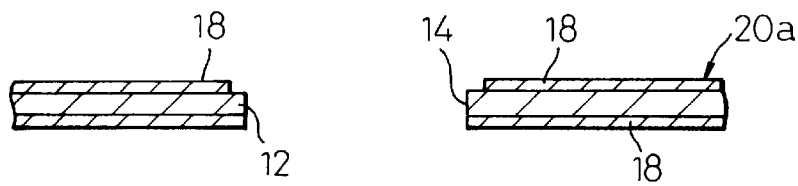
Figure 1C:
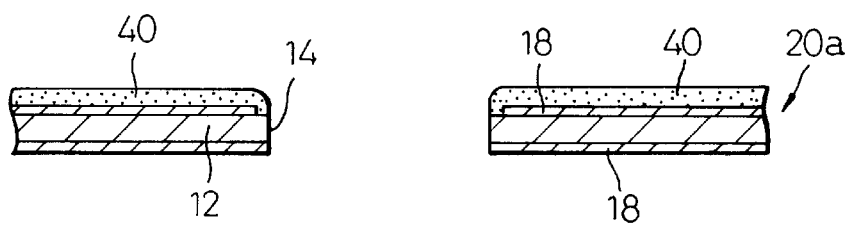
Figure 1D:
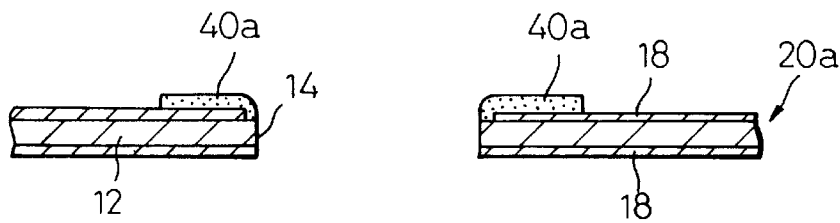

After the copper foil 11 is etched and the circuit pattern 18 has been formed, a protective coating is provided for protecting the bonding portion of the circuit pattern 18. In this embodiment, a photoresist 40 is coated on the upper surface of the inner circuit board 20a (FIG. 1(c)), and after the photoresist 40 on the bonding portion of the circuit pattern 18 has been solely exposed, the other photoresist 40 is dissolved and removed, resulting in the protective coating 40a. In FIG. 1(d), the protective coating 40a is formed on the bonding portion of the circuit pattern 18. In this regard, if there is less necessity for protecting the bonding portion, this process may be eliminated.

Since the circuit board 20a is bonded to another one via an adhesive sheet 22 (prepreg) sandwiched between the two, the protective coating 40a may be eliminated especially on the lower surface of the circuit board 20a.

The protective coating 40a has a function for temporarily protecting the bonding portion but is finally removed therefrom so that the surface of the circuit pattern 18 is exposed. Accordingly, the photoresist 40 used for this purpose is preferably one easily removable in the post process, for example, by an alkaline solvent or others.

Figure 1E:
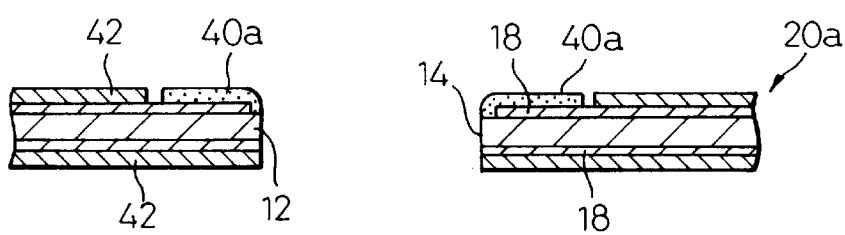

After the bonding portion of the circuit pattern 18 has been covered with the protective coating 40a, a resist 42 is coated on both surfaces of the circuit board 20a to smooth the same (FIG. 1(e)). The resist 42 is coated at a predetermined thickness so that an irregularity is remedied, which irregularity is created on the surfaces of the circuit board 20a due to the formation of the circuit pattern 18. The resist 42 is coated by a printing method or others. Since the bonding portion of the circuit pattern 18 is coated with the protective coating 40a, it is possible to prevent the resist 42 from sticking to the bonding portion when the resist 42 is coated. The resist 42 may be a solder resist.

In this embodiment, the purpose of the resist 42 coated on the surface of the inner circuit board 20a is to prevent an adhesive of the adhesive sheet 22 from flooding into the cavity by smoothing the surface of the circuit board 20a, and to prevent voids being generated between circuit boards (layers) so that they are reliably laminated with each other.

It is possible to bond the circuit boards without coating the resist 42, if the adhesive sheet made of a suitable material is selected. Accordingly, the process for coating the resist 42 onto the inner circuit board 20a is not indispensable.

Next, a second process is a laminate-forming process wherein a plurality of inner circuit boards 20a is sandwiched between a pair of outer circuit boards 20b having no opening to form a laminate.

Figure 2:
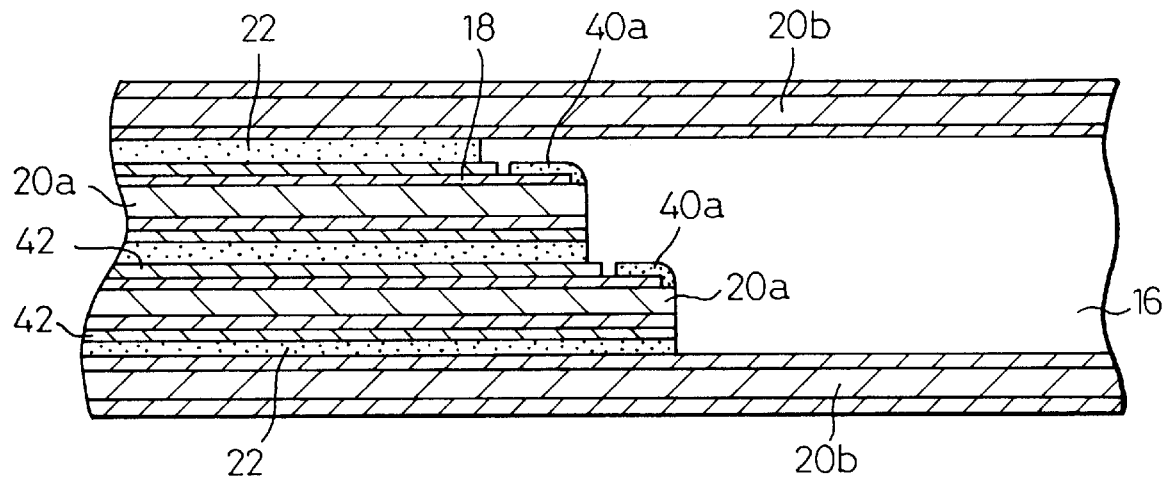
FIG. 2 is a side sectional view of a laminate obtained by sandwiching inner circuit boards between a pair of outer circuit boards.

The respective circuit boards 20a, 20b are bonded with each other by adhesive sheets 22 sandwiched between every adjacent pairs. FIG. 2 shows a main part of the laminate in an enlarged manner wherein two of the inner circuit boards 20a are bonded together. This laminate is structured by using a pair of outer circuit boards 20b having no opening as outermost substrates, between which the inner circuit boards 20a are sandwiched to form a four-layered structure in which the cavity 16 is sealed from outside.

In this embodiment, a so-called prepreg is used as the adhesive sheet 22. The prepreg is glass fibers impregnated with an adhesive to be of a sheet-shape, which is sandwiched between the inner circuit boards 20a and between the inner circuit board 20a and the outer circuit board 20b, and hot-pressed in vacuum for a predetermined time to form an integral laminate after the adhesive is completely hardened.

In this regard, while the respective circuit boards 20a, 20b are laminated to each other and hot-pressed, a core having a contour complementary to that of the cavity 16 may preferably be inserted into the cavity 16 so that the laminate can be uniformly pressed.

The protective coating 40a covering the bonding portion of the circuit pattern 18 has a function for preventing the adhesive that squeezes out of the adhesive sheet 22 from contaminating the bonding portion in the process for bonding the laminate. Also, trouble may be avoided when debris (such as a piece of glass fiber) falls onto the circuit pattern 18 during the process for positioning the adhesive sheet 22 to the inner circuit board 20a to contaminate the bonding portion, because the protective coating 40a fully covers the bonding portion.

Figure 3:
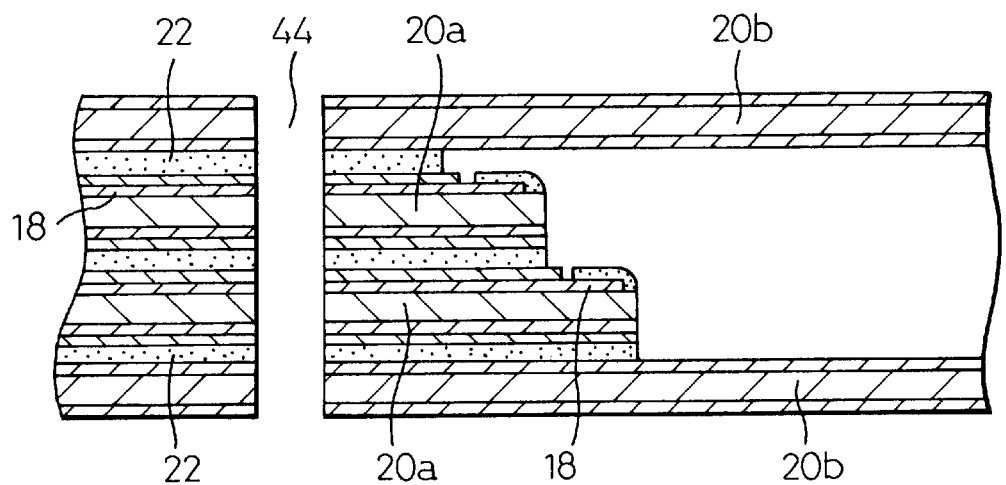
FIG. 3 is a side sectional view of the laminate of circuit boards wherein a bore is provided while penetrating the same.
Figure 4:
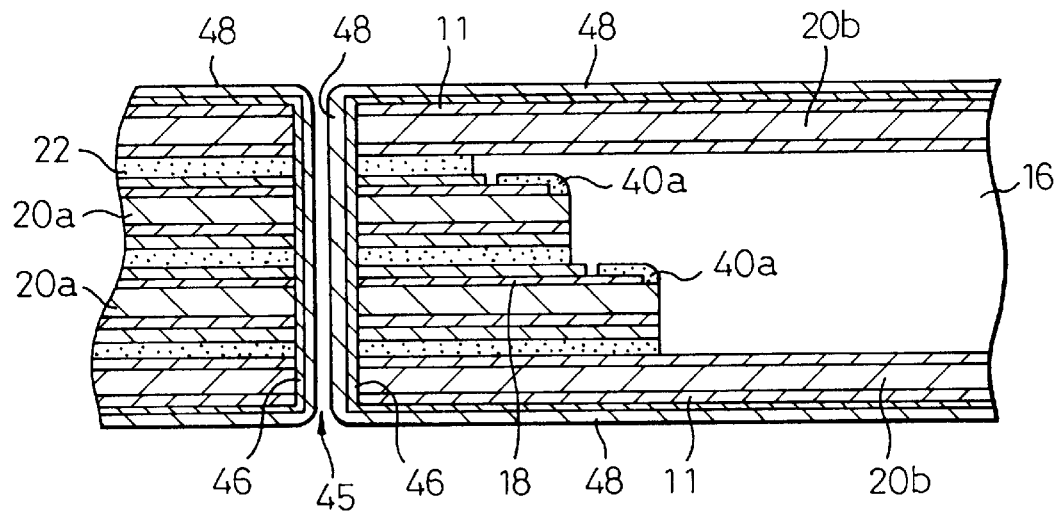
FIG. 4 is a side sectional view of the laminate wherein a copper-plating is applied to the bore to form a through-hole.

A third process will be described with reference to FIGS. 3 and 4, wherein a bore 44 is provided through the laminate for the preparation of a through-hole and copper-plating (in this embodiment, electroless plating and an electroplating of copper) is applied to the inner wall of the bore 44 and the copper foil clad on the outer surface of the outer circuit board 20b.

The bore 44 is formed by drilling the laminate. FIG. 3 illustrates a state wherein the bore 44 is provided at a position corresponding to the through-hole. In this regard, the circuit pattern 18 of the inner circuit board 20a is preliminarily patterned either to be conductive or not conductive to the through-hole.

Also in this process, an electroless plating of copper is applied to form an electroless-plated copper coating 46 on the inner wall of the bore 44 and on the copper foil 11 clad on the outer surface of the outer circuit board 20b, and an electro-plating of copper is applied to form an electro-plated coating 48 of copper on the electroless-plated coating of copper 46. FIG. 4 shows a state after the electroless plating and the electro-plating have been applied. Thus, the through-hole 45 is formed, for electrically connecting the circuit patterns in the respective circuit patterns with each other.

A fourth process is a nickel-plating process for applying nickel plating on the electro-plated copper coating 48 formed over the inner wall of the bore 44 and the copper foil 11 clad on the outer surface of the outer circuit board 20b.

Figure 5:
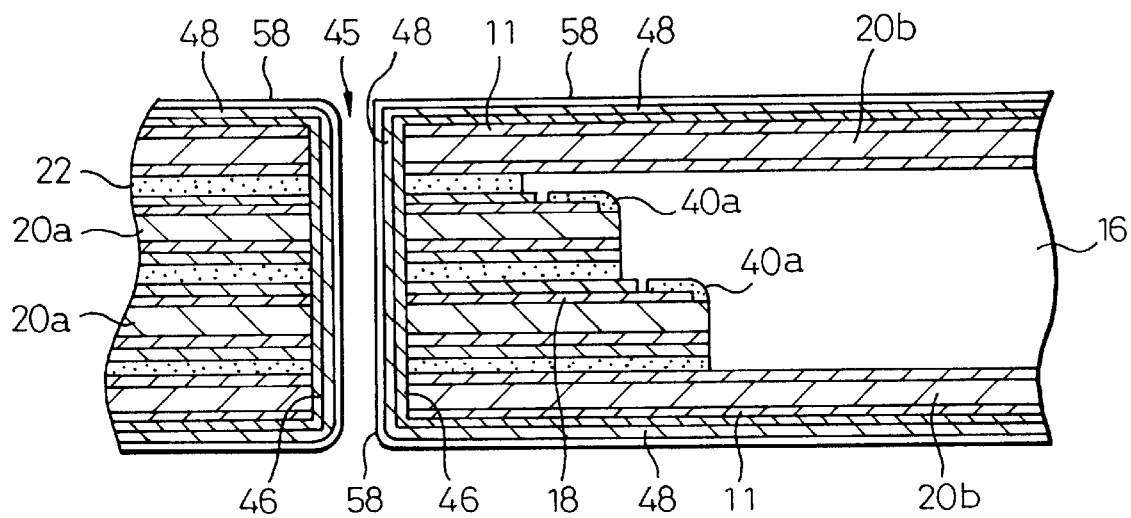
FIG. 5 is a side sectional view of the laminate wherein a plated nickel coating is formed on the plated copper coating prepared by the process shown in FIG. 4.

A nickel plating (electroless or electro-plating) is applied so that a first plated nickel coating 58 is formed on the electro-plated copper coating 48 provided on the inner wall of the through-hole 44 and on the copper foil 11 clad on the outer surface of the outer circuit board 20b. The first plated nickel coating 58 has a thickness in a range from 1 to 30 $\mu$m. FIG. 5 shows a state wherein the first nickel-plating coating 58 is formed.

Next, a fifth process is an outer circuit pattern-forming process wherein a photoresist is coated on the outer surface of the outer circuit board 20b and exposed, then developed and etched to form an outer circuit pattern on the outer surface of the outer circuit board 20b.

Figure 6:
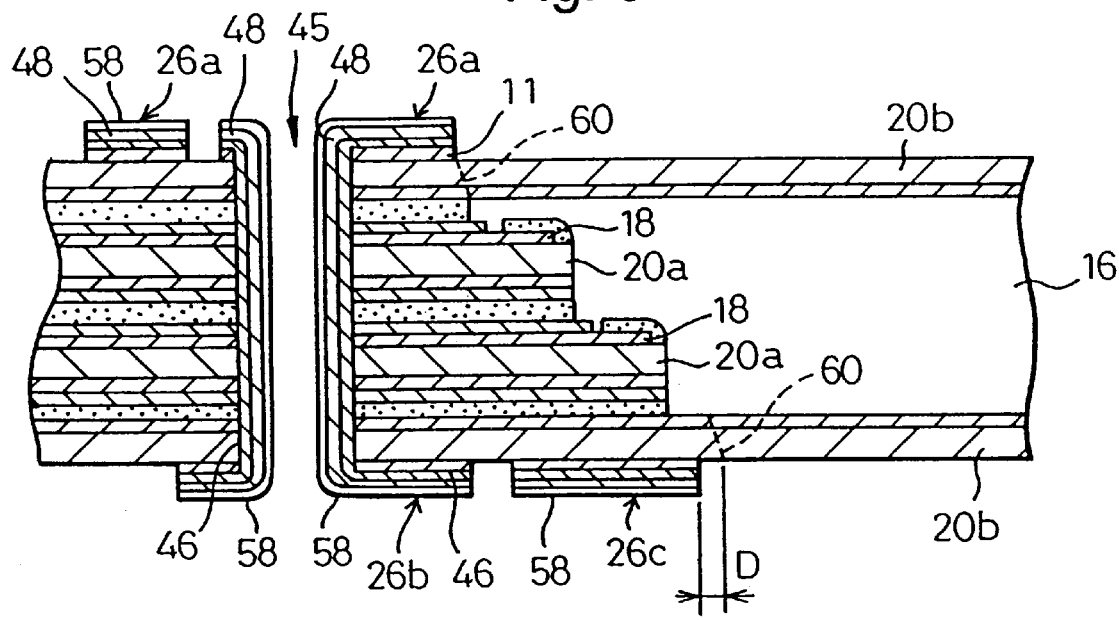
FIG. 6 is a side sectional view of the laminate wherein the plated nickel coating, the plated copper coating and a copper foil on the circuit boards are patterned.

A circuit pattern is formed by etching a conductive layer on the outer surface of the outer circuit board 20b, consisting of the first plated nickel coating 58, the electroplated copper coating 48, the electroless-plated copper coating 46 and the copper foil 11 (FIG. 6). The circuit pattern formed on the outer surface of the circuit board 20b includes a land 26a on which an external terminal such as a solder ball is bonded, a conductor 26b for the connection to an electronic part such as a capacitor or a resistor, a conductor (not shown) conductive to the land 26a, the conductor 26b and the through-hole 45, and a conductor 26c for mounting a heat-radiation plate 30. The circuit pattern is formed as follows: A photoresist is coated all over the outer surface of the outer circuit board 20b, which is then exposed in accordance with a pattern to be formed. Then, a resist pattern is obtained on the first plated nickel coating 58 by development. Thereafter, part of the conductive layer (consisting of the first plated nickel coating 58, the electro-plated copper coating 48, the electroless-plated copper coating 46 and the copper foil 11) which is not covered with the resist is removed by etching.

As shown in FIG. 6, the conductor 26c is sized to be located apart, by a predetermined distance D, from the peripheral edge of the opening 60 defining part of the cavity 16, which opening is formed in the circuit board 20b in the post process. This distance D (a recessed distance) is, for example, in a range from 0.1 to 0.2 mm. In this regard, the conductor 26c may be sized to coincide with the periphery of the opening.

As stated above, during the third process for forming the through-hole 44 in the laminate and applying electro and electroless platings of copper thereto, the fourth process for applying a nickel plating, and the fifth process for forming a circuit pattern by etching the conductive layer consisting of the first plated nickel coating 58, the electro-plated copper coating 48, the electroless-plated copper coating 46 and the copper foil 11, the inner circuit boards 20a in the interior of the laminate are completely sealed from outside. Accordingly, there is no risk that the circuit pattern 18 (mainly the wire bonding portion exposed in the inside of the cavity 16) of the inner circuit board 20a becomes thicker and wider due to the electroless/electro-plating of copper or the nickel plating to short-circuit to the other circuit pattern or is damaged by a plating liquid or an etching liquid.

Figure 7:
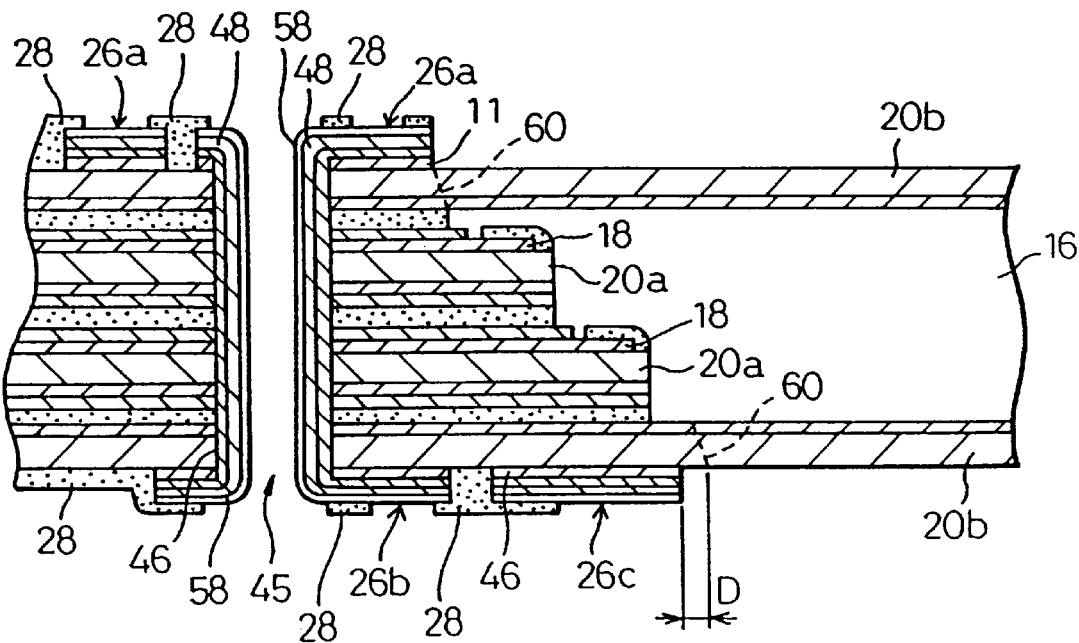
FIG. 7 is a side sectional view of the laminate wherein a protective coating is formed on the outer surface of the outer circuit board.

A sixth process is a process for providing a protective coating 28 of a solder resist or others on the outer surface of the outer circuit board 20b, for protecting the circuit pattern formed on the outer surface of the outer circuit board 20b, at least except for the through-hole 45, as shown in FIG. 7. Beside the through-hole 45, there are other portions on which no protective coating is formed, including the land 26a to be bonded to the external terminal such as a solder ball, the conductor 26b for the connection with electronic parts such as a capacitor or a resistor, and the frame-like conductor 26c for mounting the heat radiation plate 30 formed of a metallic plate such as copper.

A seventh process is a process for providing an opening 60, in correspondence to the opening 14 in the inner circuit board 20a, in at least one of the outer circuit boards 20b sealing the cavity 16, so that the cavity 16 is open.

Figure 8:
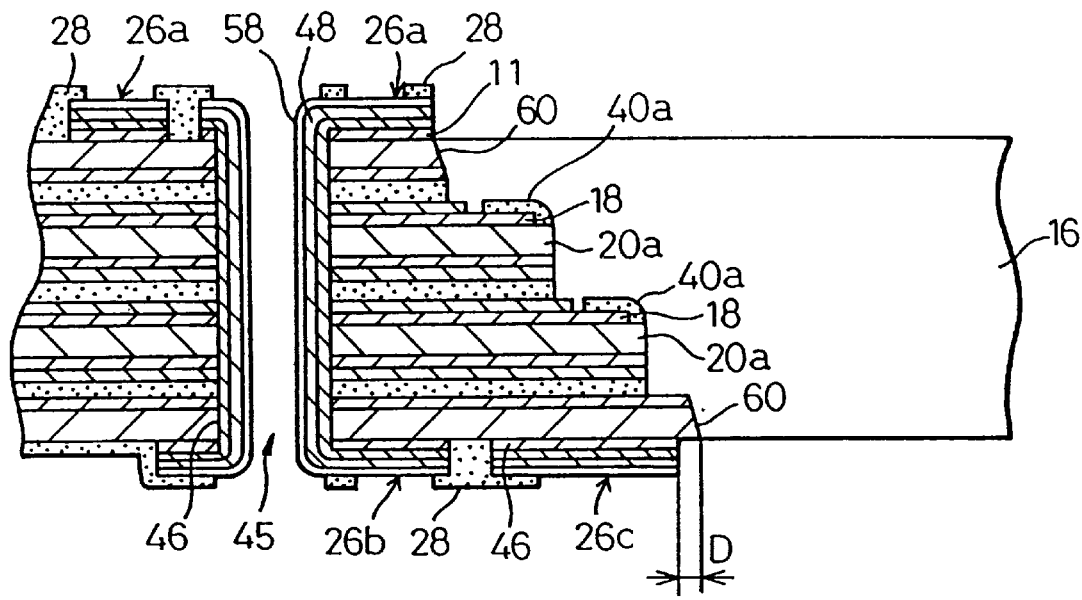
FIG. 8 is a side sectional view of the laminate wherein a cavity is open by providing an opening in the outer circuit board.

According to this embodiment, as shown in FIG. 8, the opening 60 is provided in each of the outer circuit boards 20b to open the cavity 16. In this regard, the operation for providing the opening is carried out by a router or the like. In a case wherein the protective coating 40a has been preliminarily applied onto the bonding portion of the circuit pattern 18 of the inner circuit board 20a, since there is the protective coating 40a on the bonding portion of the circuit pattern 18 of the inner circuit board 20a when the outer circuit board 20b is open, the protective coating 40a is removed by using a solvent such as an alkaline solvent to expose the circuit pattern 18 in the inside of the cavity. Since the protective coating 40a is easily soluble by the solvent, it is possible to remove the same without adversely effecting in the circuit pattern 18 or other conductors in the inner circuit board 20a.

Figure 9:
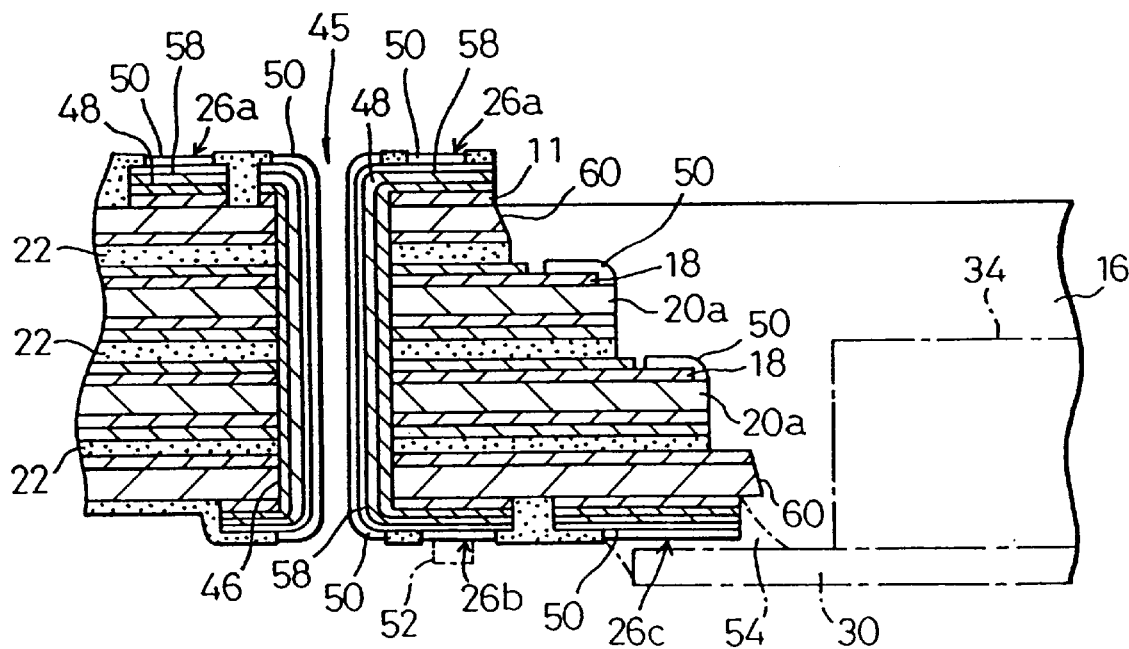
FIG. 9 is a side sectional view of the laminate wherein a plated nickel/gold coating is formed on bonding portions in the cavity and the through-hole.

An eighth process is a second plating process for applying a ground nickel plating and a gold plating on the bonding portion to form a plated nickel/gold coating 50 thereon. The plated nickel/gold coating 50 is also formed on the land 26a, the conductor 26b, the conductor 26c and the through-hole 45 conductive to the circuit pattern 18 as shown in FIG. 9. The plated coating 50 formed in the second plating process has a thickness in the nickel coating in a range from 1 to 10 μm, and in the gold coating in a range from 0.1 to 3 μm.

After the above process, the heat radiation plate 30 and the electronic part 52 are soldered as shown in a chain line. The heat radiation plate 30 has a plated nickel coating or a plated nickel/gold coating on the surface of the copper plate.

Then, a semiconductor element 34 is mounted into the cavity 16 of the semiconductor package to complete a semiconductor device.

According to this method, the masking and demasking of the bonding portion of the circuit pattern in the inner circuit board can be eliminated when the electroless/electro-plating of copper is applied to the through-hole 45, whereby it is possible to improve the workability thereof. Also, it is possible to form two or more plated nickel coatings on the inner wall of the through-hole 45, resulting in a through-hole 45 resistant to heat-shock.

Results obtained by actual heat-shock tests are listed in Table below. As is apparent from Table, the semiconductor package produced according to the present invention has a reliability as high as 1000 cycles or more, which is the same as in the conventional method wherein a pin is inserted and soldered to a through-hole or a solder is filled into the through-hole under the following conditions.

TABLE

| Through-hole | 100 cycles | 500 cycles | 1000 cycles |
| --- | --- | --- | --- |
| Not filled | OK | NG | NG |
| Pin + solder | OK | OK | OK |
| Solder | OK | OK | OK |
| Invention | OK | OK | OK |

The conditions for the heat-shock test were in conformity with MIL-STD-883C, Method 1010, TEMPCYCLE Condition, −55° C./125° C., 30 min/30 min.

While the process for forming a first plated nickel coating on the inner wall of the through-hole is carried out between the first plating process and the outer circuit pattern-forming process in the above embodiment, it may be carried out at any time between the outer circuit pattern-forming process (the fifth process) and the cavity opening process (the seventh process).

According to such an embodiment, since the outer circuit pattern has already been formed during the Ni-plating step is carried out, it is no longer necessary to etch the different metals, such as copper-plating and Ni-plating, as the above-mentioned embodiment. In addition, according to such an embodiment, Ni-plating can also be applied to the side faces of the outer circuit pattern.

In other words, while the sixth process for forming the protective coating 28 is carried out between the outer circuit pattern-forming process and the cavity opening process in the above embodiment, the process for forming a first plated nickel coating may be interposed between the fifth and sixth processes or between the sixth and seventh processes.

That is, the process for forming a first plated nickel coating on the inner wall of the through-hole 45 may be carried out at any time after the third process (wherein the bore 44 for the through-hole is provided and an electroless-plated copper coating and an electro-plated copper coating are applied to the inner wall of the bore 44) has been finished, unless the seventh process (the cavity-opening process) starts. This process may be repeated twice or more.

Alternative to the process for forming a first plated nickel coating, a process for forming a plated nickel/cobalt alloy coating, a plated nickel/tungsten alloy coating, or a plated nickel/tungsten/cobalt alloy coating may be employed so that a more reliable plated coating is obtainable.

It is conceivable that, alternative to the nickel plating, a copper plating may be repeated twice to improve the resistance to heat-shock. However, the thickness of the copper coating thus obtained must be 30 μm or more if the same effect as that of the nickel coating is required. Since it is impossible to form fine outer circuit patterns at a high density if the plated coating has such a large thickness, or an inner diameter of the through-hole becomes smaller due to the plated coating, it is difficult to insert pins into the through-holes, for example, in a case of PGA. While it is also conceivable to apply a gold plating twice instead of the nickel plating, there are problems similar to the copper plating and also a problem in that the production cost increases.

Due to these reasons, the nickel plating, nickel/cobalt alloy plating, nickel/tungsten alloy plating, and nickel/tungsten/cobalt alloy plating are suitably employed in the present invention.

In the above embodiment, a semiconductor package of a PLGA type is used for describing the present invention. However, the present invention should not be limited thereto but may be applied to a PBGA type using a solder ball as the external terminal 24 and a PPGA type using a lead pin as the external terminal 24.

According to a method for producing a semiconductor package of the present invention, the masking and demasking of the bonding portion of the circuit pattern in the inner circuit board can be eliminated when the electroless/electroplating of copper is applied to the through-hole, whereby it is possible to improve the workability thereof. Also, it is possible to form two or more plated nickel coatings on the inner wall of the through-hole 45, resulting in a through-hole 45 resistant to heat-shock.

We claim:

1. A method for producing a semiconductor package comprising a laminate of a plurality of resinous substrates having a cavity for accommodating a semiconductor element, through-holes and circuit patterns; the through-holes and some of the circuit patterns being coated with a plated nickel/gold coating; said method comprising the following steps of:

(a) a step for producing an inner circuit board, wherein a resinous substrate clad with a metallic foil is bored to have an opening for forming the cavity and subjected to an etching treatment to form inner circuit patterns on the surface thereof;

(b) a step for forming the laminate by sandwiching a plurality of the inner circuit boards between a pair of outer circuit boards having no opening, thereby forming a sealed cavity;

(c) a first plating step including first forming bores for the through-holes and then applying a plated copper coating to the inner wall of the through-hole and the metallic foil covering the outer surface of the outer circuit board;

(d) a step for applying a plated nickel coating to at least the through-holes;

(e) a step for forming outer circuit patterns on the outer surface of the outer circuit board by etching the metallic foil and the plated copper coating on the outer surface of the outer circuit board;

(f) a step for opening the cavity by providing an opening in at least one of the outer circuit boards corresponding to the opening of the inner circuit board; and (g) a second plating step for applying a plated nickel coating and a plated gold coating to the inner circuit patterns, the through-holes, and the outer circuit patterns.

2. A method as set forth in claim 1, wherein a thickness of the plated nickel coating obtained in step (d) is in a range from 1 μm to 30 μm.

3. A method as set forth in claim 1, wherein step (d) comprises a nickel/cobalt alloy-plating step.

4. A method as set forth in claim 1, wherein step (d) comprises a nickel/tungsten alloy plating step.

5. A method as set forth in claim 1, wherein step (d) comprises a nickel/tungsten/cobalt alloy plating step.

6. A method for producing a semiconductor package comprising a laminate of a plurality of resinous substrates having a cavity for accommodating a semiconductor element, through-holes and circuit patterns; the through-holes and some of the circuit patterns being coated with a plated nickel/gold coating; said method for comprising the following steps of:

(a) a step for producing an inner circuit board, wherein a resinous substrate clad with a metallic foil is bored to have an opening for forming the cavity and subjected to an etching treatment to form inner circuit patterns on the surface thereof;

(b) a step for forming the laminate by sandwiching a plurality of the inner circuit boards between a pair of outer circuit boards having no opening, thereby forming a sealed cavity;

(c) a first plating step including first forming bores for the through-holes and then applying a plated copper coating to the inner wall of the through-hole and the metallic foil covering the outer surface of the outer circuit board;

(d) a step for forming outer circuit patterns on the outer surface of the outer circuit board by etching the metallic foil and the plated copper coating on the outer surface of the outer circuit board;

(e) a step for applying a plated nickel coating to the through-holes;

(f) a step for opening the cavity by providing an opening in at least one of the outer circuit boards corresponding to the opening of the inner circuit board; and (g) a second plating step for applying a plated nickel coating and a plated gold coating to the inner circuit patterns, the through-holes and the outer circuit patterns.

7. A method as set forth in claim 6, wherein a thickness of the plated nickel coating obtained in step (e) is in a range from 1 μm to 30 μm.

8. A method as set forth in claim 6, wherein step (e) comprises a nickel/cobalt alloy-plating step.

9. A method as set forth in claim 6, wherein step (e) comprises a nickel/tungsten alloy plating step.

10. A method as set forth in claim 6, wherein step (e) comprises a nickel/tungsten/cobalt alloy plating step.

* * * * *